United States Patent
Edelstein et al.

(10) Patent No.: US 8,772,942 B2
(45) Date of Patent: Jul. 8, 2014

(54) INTERCONNECT STRUCTURE EMPLOYING A MN-GROUP VIIIB ALLOY LINER

(75) Inventors: Daniel C. Edelstein, Yorktown Heights, NY (US); Takeshi Nogami, Albany, NY (US); Kazumichi Tsumura, Guilderland, NY (US); Takamasa Usui, Selkirk, NY (US)

(73) Assignees: International Business Machines Corporation, Armonk, NY (US); Toshiba America Electronic Components, Inc., Irvine, CA (US)

( * ) Notice: Subject to any disclaimer, the term of this patent is extended or adjusted under 35 U.S.C. 154(b) by 679 days.

(21) Appl. No.: 12/693,637

(22) Filed: Jan. 26, 2010

(65) Prior Publication Data

US 2011/0180309 A1    Jul. 28, 2011

(51) Int. Cl.
 *H01L 23/48*    (2006.01)
(52) U.S. Cl.
 USPC ............ 257/774; 257/E23.001; 257/E23.141; 257/621; 438/637
(58) Field of Classification Search
 USPC .......... 257/751, 621, 774; 174/257; 427/97.6; 438/637
 See application file for complete search history.

(56) References Cited

U.S. PATENT DOCUMENTS

| | | | |
|---|---|---|---|
| 2008/0054466 A1* | 3/2008 | Nasu et al. | 257/751 |
| 2008/0206982 A1* | 8/2008 | Suzuki | 438/627 |
| 2008/0230375 A1* | 9/2008 | Maekawa et al. | 204/192.15 |
| 2011/0017499 A1* | 1/2011 | Yang et al. | 174/257 |

* cited by examiner

*Primary Examiner* — Elias M Ullah
(74) *Attorney, Agent, or Firm* — Scully, Scott, Murphy & Presser, P.C.; Yuanmin Cai

(57) ABSTRACT

A metallic liner stack including at least a Group VIIIB element layer and a CuMn alloy layer is deposited within a trench in a dielectric layer. Copper is deposited on the metallic liner stack and planarized to form a conductive interconnect structure, which can be a metal line, a metal via, or a combination thereof. The deposited copper and the metallic liner stack are annealed before or after planarization. The Mn atoms are gettered by the Group VIIIB element layer to form a metallic alloy liner including Mn and at least one of Group VIIIB elements. Mn within the metallic alloy liner combines with oxygen during the anneal to form MnO, which acts as a strong barrier to oxygen diffusion, thereby enhancing the reliability of the conductive interconnect structure.

15 Claims, 11 Drawing Sheets

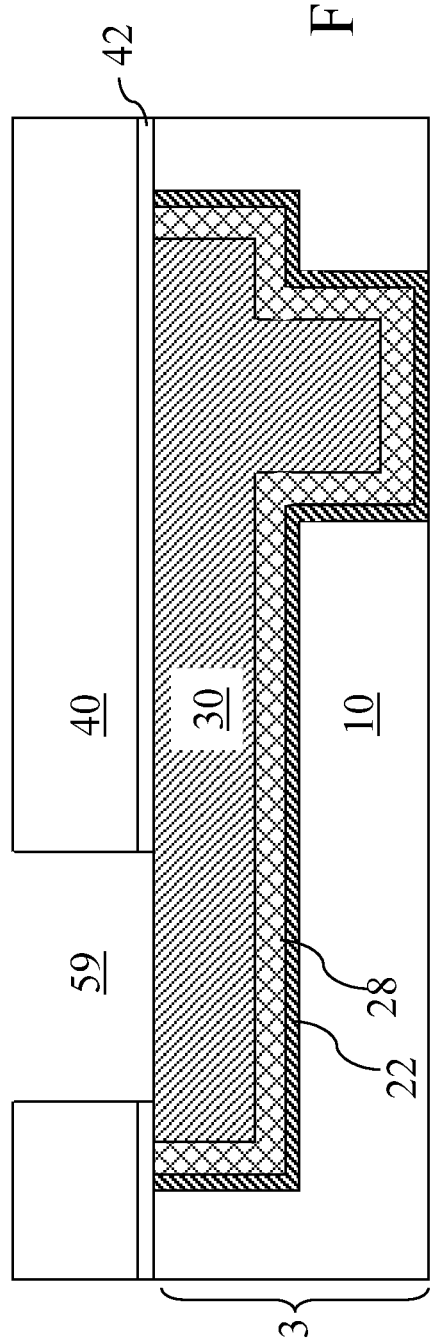
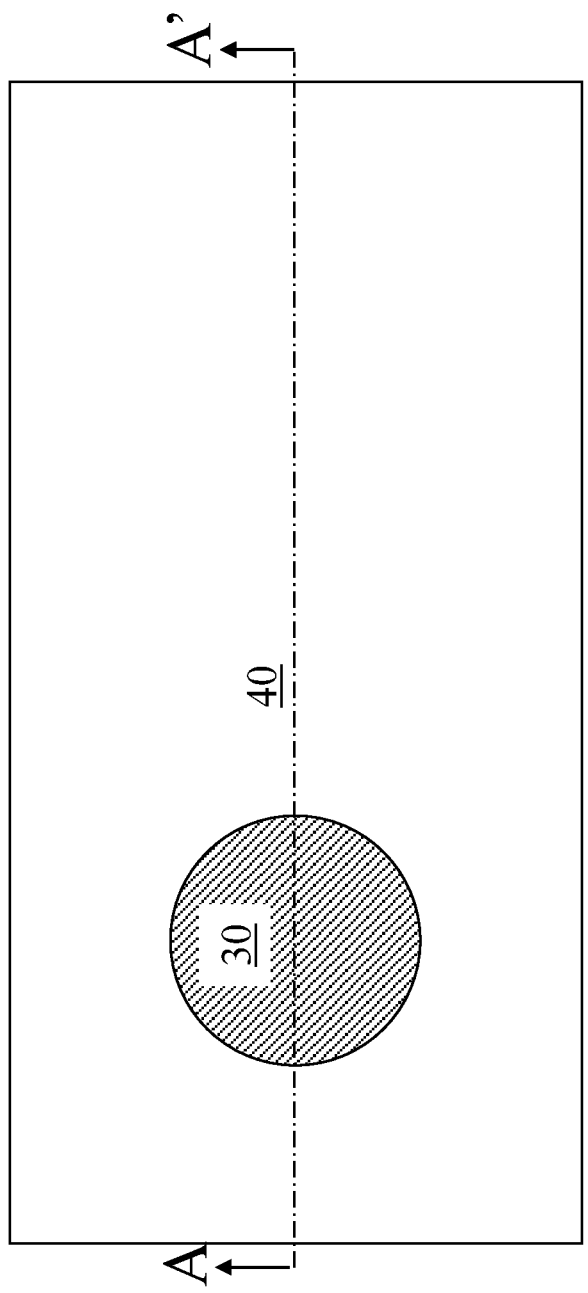

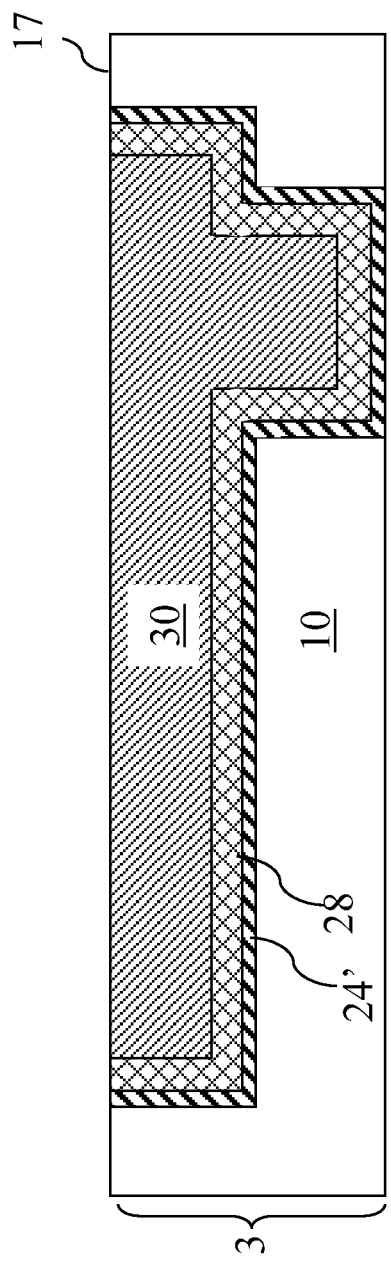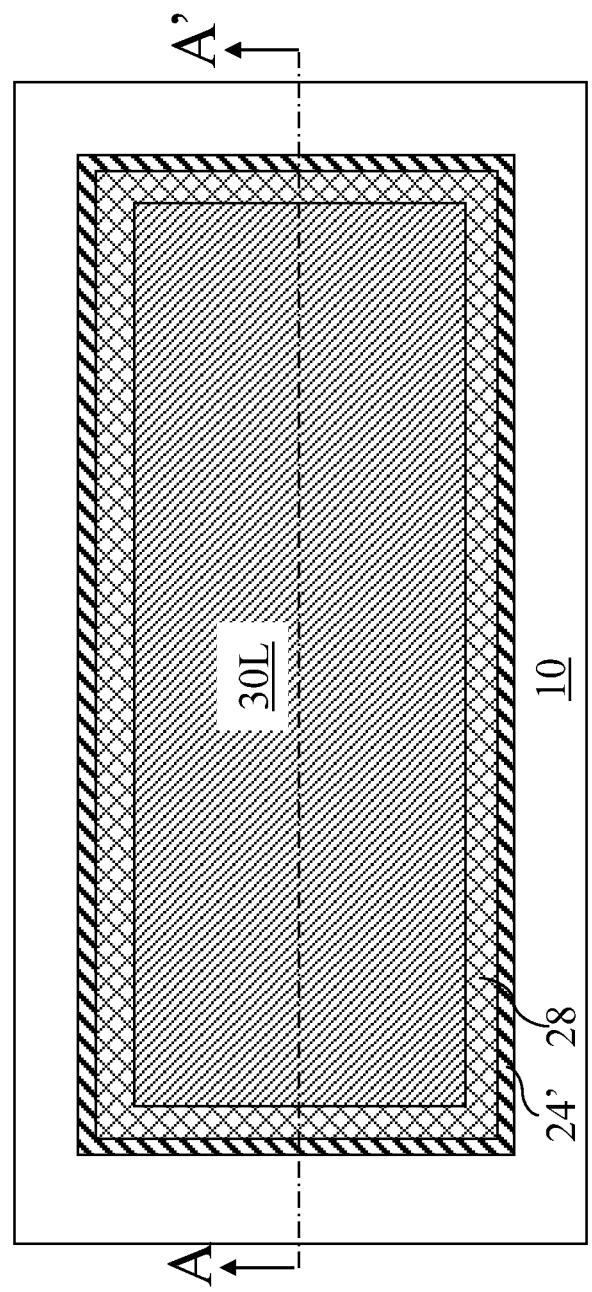

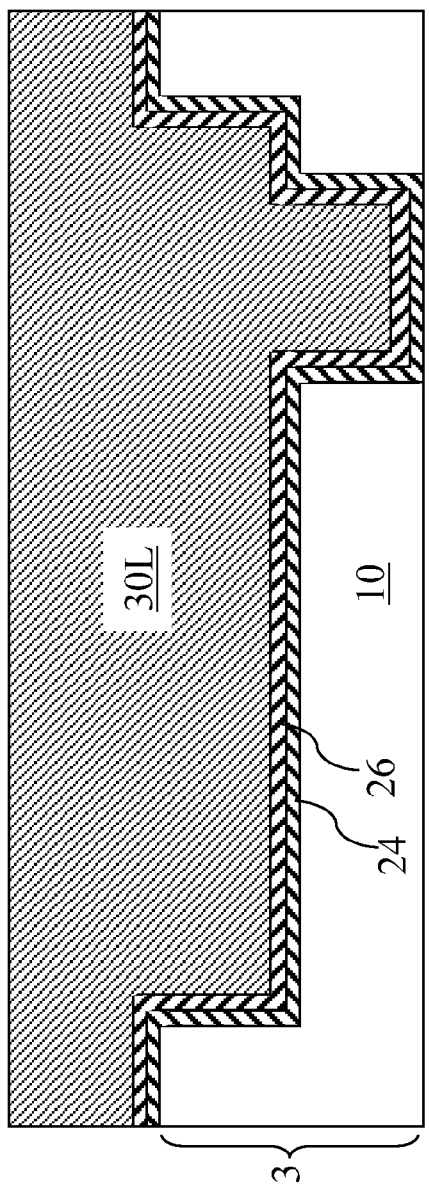
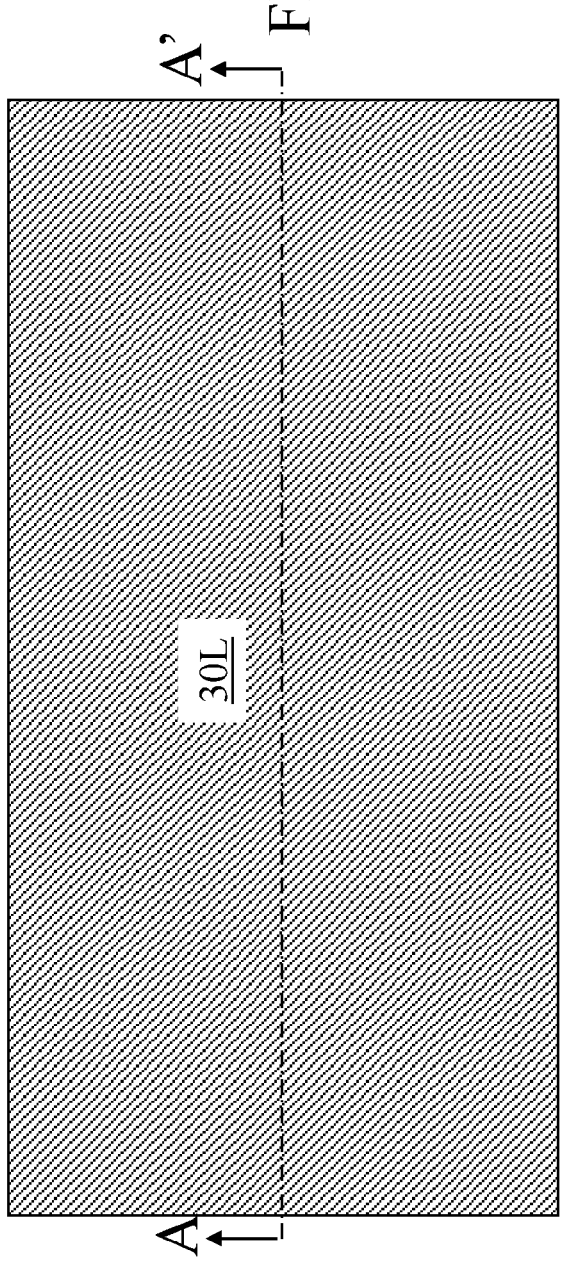

INTERCONNECT STRUCTURE EMPLOYING A MN-GROUP VIIIB ALLOY LINER

FIELD OF THE INVENTION

The present invention relates to metal interconnect structures, and particularly to metal interconnect structures including a metallic alloy liner including Mn and at least one Group VIIIB element for preventing diffusion of copper and oxygen, and methods of manufacturing the same.

BACKGROUND OF THE INVENTION

A metal line comprises a lattice of metal ions and non-localized free electrons. The metal ions are formed from metal atoms that donate some of their electrons to a common conduction band of the lattice, and the non-localized free electrons move with relatively small resistance within the lattice under an electric field. Normal metal lines, excluding superconducting materials at or below a superconducting temperature, have finite conductivity, which is caused by interaction of electrons with crystalline imperfections and phonons which are thermally induced lattice vibrations.

When electrical current flows in the metal line, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the conductor material. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is generally greater than the electrostatic force. Thus, metal ions are subjected to a net force in the opposite direction of the current, or in the direction of the flow of the electrons.

Scaling of semiconductor devices in advanced semiconductor devices is accompanied by corresponding scaling of metal interconnect structures. Because the size of copper grains is limited by the dimensions of metal interconnect structures, scaling decreases the size of grains in copper structures, while increasing the defect density. High defect density (i.e., smaller grain size of the metal) or high temperature typically increases electron scattering, and consequently, the amount of momentum transfer from the electrons to the conductor material. Such momentum transfer, if performed sufficiently cumulatively, may cause the metal ions to dislodge from the lattice and move physically. The mass transport caused by the electrical current, or the movement of the conductive material due to electrical current, is termed electromigration in the art.

In applications where high direct current densities are used, such as in metal interconnects of semiconductor devices, electromigration causes a void in a metal line or in a metal via. Such a void results in a locally increased resistance in the metal interconnect, or even an outright circuit "open." In this case, the metal line or the metal via no longer provides a conductive path in the metal interconnect. Formation of voids in the metal line or the metal via can thus result in a product failure in semiconductor devices.

The electromigration failure is accelerated where copper is oxidized by diffusion of impurities from surrounding dielectric materials. Therefore, electromigration performance and reliability of metal interconnects can be enhanced by retarding oxidation of copper.

SUMMARY OF THE INVENTION

The present invention provides electromigration resistant metal interconnect structures including a metallic alloy liner including Mn and at least one of Group VIIIB element, and methods of manufacturing such electromigration resistant metal interconnect structures.

A metallic liner stack including at least a Group VIIIB element layer and a CuMn alloy layer is deposited within a trench in a dielectric layer. The trench may be a line trench, a via hole, or a combination thereof. The Group VIIIB element layer improves the wetting of the CuMn alloy layer so that the thickness of the CuMn alloy layer can be minimized. Copper is deposited on the metallic liner stack and planarized to form a conductive interconnect structure, which can be a metal line, a metal via, or a combination thereof. Due to the presence of Cu in the CuMn alloy layer, the deposited Cu has a strong adhesion to the underlying CuMn alloy layer. The deposited copper and the metallic liner stack are annealed before or after planarization. The Mn atoms are gettered by the Group VIIIB element layer to form a metallic alloy liner including Mn and at least one of Group VIIIB elements. Mn within the metallic alloy liner combines with oxygen during the anneal to form MnO, which acts as a strong barrier to oxygen diffusion, thereby enhancing the reliability of the conductive interconnect structure.

According to an aspect of the present invention, a metal interconnect structure is provided, which includes: a dielectric material layer having at least one patterned recess therein; a metallic alloy liner located in the at least one patterned recess, the metallic alloy liner including Mn and at least one Group VIIIB element; and a Cu-containing conductive structure located on the metallic alloy liner.

According to another aspect of the present invention, another metal interconnect structure is provided, which includes: a dielectric material layer having at least one patterned recess therein; a metallic liner stack located in the at least one patterned recess, the metallic liner stack including a Group VIIIB element layer and a CuMn alloy layer; and a Cu-containing conductive structure located on the metallic liner stack.

According to yet another aspect of the present invention, a method of forming a metal interconnect structure is provided. The method includes forming at least one patterned recess in a dielectric material layer; depositing a Group VIIIB element layer in the at least one patterned recess; depositing a CuMn alloy layer on the Group VIIIB element layer; and forming a metallic alloy liner including Mn and at least one Group VIIIB element by annealing the Group VIIIB element layer and the CuMn alloy layer, wherein Mn in the CuMn alloy layer diffuses into the Group VIIIB element layer to form the metallic alloy liner.

BRIEF DESCRIPTION OF THE DRAWINGS

FIG. 1A is a vertical cross-sectional view along the plane A-A' in FIG. 1B. FIG. 1B is top-down view.

FIG. 2A is a vertical cross-sectional view along the plane A-A' in FIG. 2B. FIG. 2B is top-down view.

FIG. 3A is a vertical cross-sectional view along the plane A-A' in FIG. 3B. FIG. 3B is top-down view.

FIG. 4A is a vertical cross-sectional view along the plane A-A' in FIG. 4B. FIG. 4B is top-down view.

FIG. 5A is a vertical cross-sectional view along the plane A-A' in FIG. 5B. FIG. 5B is top-down view.

FIGS. 6A and 6B are views of the first exemplary structure after formation of an upper dielectric layer and a recessed region therein according to the first embodiment of the present invention. FIG. 6A is a vertical cross-sectional view along the plane A-A' in FIG. 6B. FIG. 6B is top-down view.

FIG. 7A is a vertical cross-sectional view along the plane A-A' in FIG. 7B. FIG. 7B is horizontal cross-sectional view along the plane B-B' in FIG. 7A.

FIG. 8A is a vertical cross-sectional view along the plane A-A' in FIG. 8B. FIG. 8B is top-down view.

FIGS. 9A and 9B are views of the second exemplary structure after annealing and planarization of the Cu-containing material layer to form a Cu-containing conductive structure according to the second embodiment of the present invention. FIG. 9A is a vertical cross-sectional view along the plane A-A' in FIG. 9B. FIG. 9B is top-down view.

FIGS. 10A and 10B are views of a third exemplary structure after formation of a Cu-containing material layer according to a third embodiment of the present invention. FIG. 10A is a vertical cross-sectional view along the plane A-A' in FIG. 10B. FIG. 10B is top-down view.

FIG. 11A is a vertical cross-sectional view along the plane A-A' in FIG. 11B. FIG. 11B is top-down view.

DETAILED DESCRIPTION OF THE INVENTION

Figure 1A:
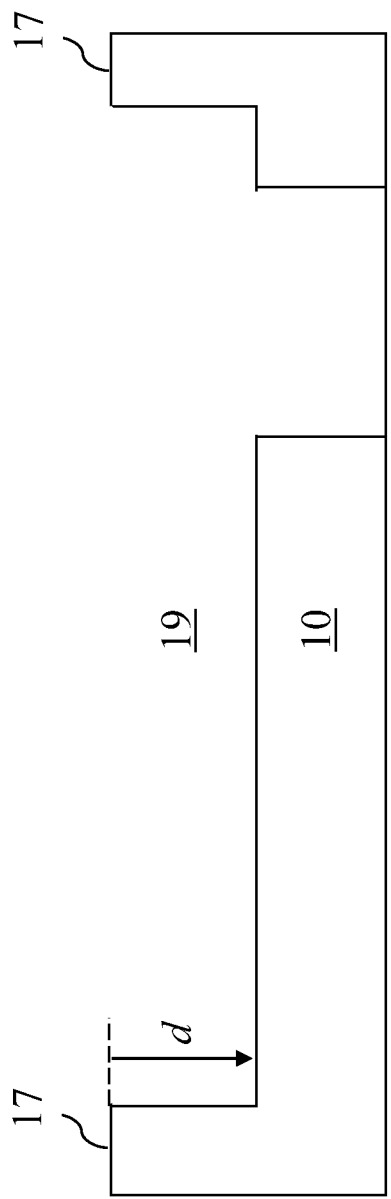
FIGS. 1A and 1B are views of a first exemplary structure after formation of at least one patterned recess according to a first embodiment of the present invention.

As stated above, the present invention relates to metal interconnect structures including a metallic alloy liner including Mn and at least one Group VIIIB element for preventing diffusion of copper and oxygen and methods of manufacturing the same, which are described herein with accompanying figures. Throughout the drawings, the same reference numerals or letters are used to designate like or equivalent elements. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. An element "abuts" another element when a physical interface area providing a direct contact is present between the element and the other element.

Figure 1B:
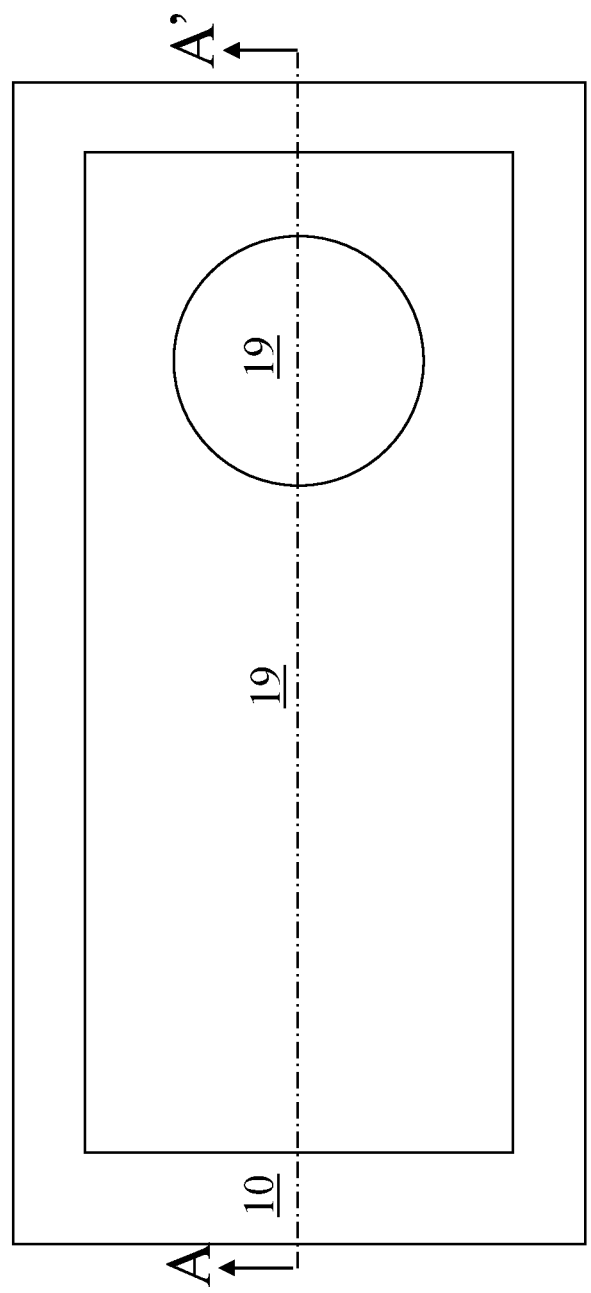

Referring to FIGS. 1A and 1B, a first exemplary structure according to a first embodiment of the present invention includes a dielectric material layer 10 containing at least one recess 19. The at least one recess 19 can be a trench formed in the shape of a metal line to be subsequently formed for providing a horizontal electrically conductive path, or can be a via hole in the shape of a metal via to be subsequently formed for providing a vertical electrically conductive path, or a combination of both. The at least one recess 19 is formed below a topmost surface 17 of the dielectric material layer 10. A semiconductor substrate (not shown) including at least one semiconductor device may be located beneath the dielectric material layer 10. The semiconductor substrate may abut the bottom surface of the dielectric material layer 10, or at least one intervening metal interconnect structure (not shown) including at least one intervening dielectric material layer embedding at least one metal wiring structure may be present between the bottom surface of the dielectric material layer 10 and the semiconductor substrate.

The outer perimeter of the at least one recess 19 may have a substantially rectangular shape, any polygonal shape, any elliptical shape, any curvilinear closed shape, or a combination thereof so that the outer perimeter as seen from a top-down view such as FIG. 1B has a closed shape. While this embodiment is described with exemplary metal interconnect structures formed with a dual damascene method, this embodiment may also be practiced with a dielectric material layer 10 formed with a single damascene method, and such variations are explicitly contemplated herein.

The dielectric material layer 10 may comprise an oxide based dielectric material, which has a dielectric constant k from 3.6 to 3.9, or a low-k dielectric material, which has a dielectric constant k of 3.0 or less, preferably less than 2.8, and more preferably less than 2.5. Non-limiting examples of the oxide based dielectric material include undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the dielectric material layer 10. The dielectric material layer 10 may comprise a stack of at least two of the oxide based conventional dielectric material, the spin-on low-k dielectric material, and the CVD low-k dielectric material.

The thickness of the dielectric material layer 10 may be from 50 nm to 2 µm, and typically from 100 to 500 nm, although lesser and greater thicknesses can also be employed. If the at least one recess 19 includes a line trench and a via hole in a manner compatible with dual damascene scheme, the depth d of the line trench may be from 20% to 80%, and typically from 35% to 65%, of the thickness of the dielectric material layer 10, although lesser and greater percentages can be employed also. In case a single damascene method is employed, the at least one recess 19 can be a line trench having the same depth as the thickness of the dielectric material layer 10 or a via hole having the same depth as the thickness of the dielectric material layer 10.

The at least one recess 19 is formed by lithographic methods and an anisotropic etch. For example, a photoresist may be applied over a blanket film of the dielectric material layer 10 without any pattern and having a top surface at the level of the topmost surface 17 of the dielectric material layer 10. The photoresist is lithographically patterned, and the pattern in the photoresist is transferred into the blanket film of the dielectric material layer 10 by vertically recessing exposed portions, which is the area of the at least one recess 19. An anisotropic etch such as a reactive ion etch is employed to recess the exposed surfaces. The photoresist is subsequently removed selective to the dielectric material layer 10. If the at least one recess 19 includes a line trench and a via hole, the lithographic patterning can be employed repeated to form the line trench and the via hole successively. The formation of the via hole can precede or follow formation of the line trench.

The sidewalls of the at least one recess 19 may be substantially vertical, or may have an inward taper. The taper angle may be from 0 degree to 30 degrees, and typically from 1 degrees to 15 degrees, depending on the material of the dielectric material layer 10, the width of the opening at the topmost surface 17 of the at least one recess 19, the etch chemistry employed in etching the at least one recess 19, and the depth d of the at least one recess 19.

Figure 2A:
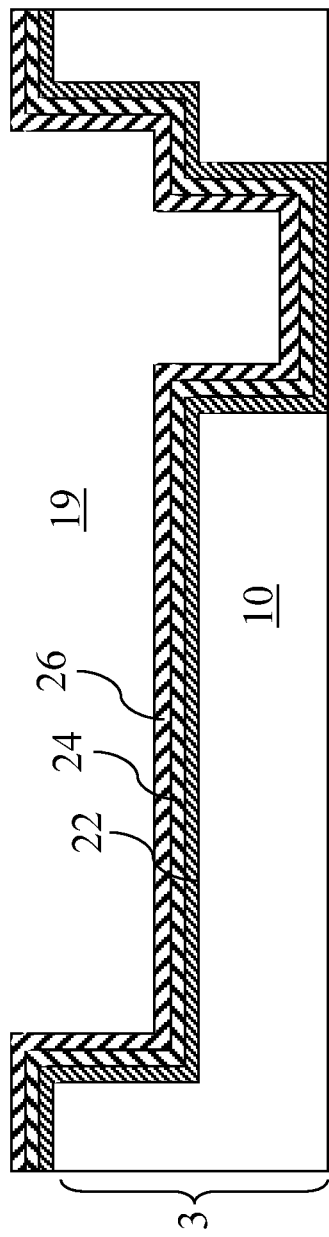
FIGS. 2A and 2B are views of the first exemplary structure after formation of a barrier metallic liner, a Group VIIIB element layer, and a CuMn alloy layer according to the first embodiment of the present invention.
Figure 2B:
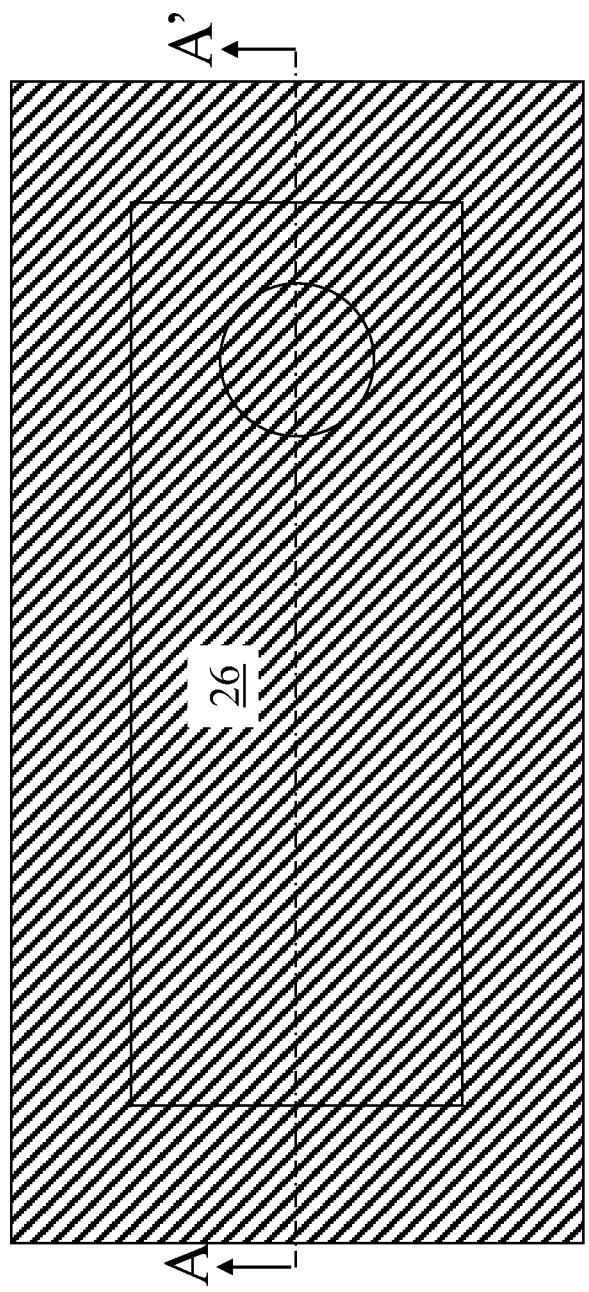

Referring to FIGS. 2A and 2B, a metallic liner stack is deposited on all exposed surfaces of the at least one recess 19 and the topmost planar surface of the dielectric material layer 10. The metallic liner stack includes, from bottom to top, a barrier metallic liner 22, a Group VIIIB element layer 24, and a CuMn alloy layer 26.

The barrier metallic liner 22 is formed directly on surfaces of the dielectric material layer 10 in the at least one patterned recess 19 and the topmost planar surface of the dielectric material layer 10. The barrier metallic liner 22 includes at least one metal selected from Group IVB elements, Group VB elements, and Group VIB elements. In other words, the barrier metallic liner 22 includes at least one metal selected from Ti, V, Cr, Zr, Nb, Mo, Hf, Ta, W, Rf, and Ha. The barrier metallic liner 22 can include the at least one metal in an elemental form, in the form of an intermetallic alloy, in the form of a conductive nitride of a single metallic element, or in the form or a conductive nitride of an alloy of metallic elements. In a non-limiting example, the barrier metallic liner 22 can be composed of Ti, Ta, W, TiN, TaN, WN, a combination thereof, or an alloy thereof.

The thickness of the barrier metallic liner 22 can be from 1 nm to 10 nm, although lesser and greater thicknesses can also be employed. The barrier metallic liner 22 impedes diffusion of materials, which can be a conductive material such as copper or an impurity such as oxygen, across the barrier metallic liner 22. In addition, the barrier metallic liner 22 adheres to the dielectric material layer 10 so that material within the barrier metallic liner 22 is attached to the dielectric material layer 10. The barrier metallic liner 22 can be formed by physical vapor deposition (PVD), chemical vapor deposition (CVD), electroless plating, evaporation, or other suitable deposition methods.

The Group VIIIB element layer 24 is formed directly on surfaces of the barrier metallic liner 22. The Group VIIIB element layer 24 includes at least one metal selected from Group VIIIB elements. In other words, the Group VIIIB element layer 24 includes at least one metal selected from Fe, Co, Ni, Ru, Rh, Pd, Os, Ir, and Pt. The Group VIIIB element(s) in the Group VIIIB element layer 24 provide(s) both high adhesion strength to the barrier metallic liner 22 and affinity to Mn to attract Mn from the CuMn alloy layer 26 during a subsequent annealing step. The Group VIIIB element layer 24 can include the at least one metal in an elemental form or in the form of an intermetallic alloy. Thus, the Group VIIIB element layer 24 is composed of a single elemental metal or an intermetallic alloy selected from Fe, Co, Ni, Ru, Rh, Pd, Os, Ir, and Pt. Among the Group VIIIB elements, it has been observed during experiments leading to this invention that Ru and Ir are particularly effective. Preferably, the Group VIIIB element layer 24 includes at least one of Ir and Ru. Preferably, the Group VIIIB element layer 24 consists essentially of Ir, Ru, or an alloy of Ir and Ru.

The thickness of the Group VIIIB element layer 24 can be from 1 nm to 5 nm, although lesser and greater thicknesses can also be employed. The Group VIIIB element layer 24 can be formed by physical vapor deposition (PVD), chemical vapor deposition (CVD), electroless plating, evaporation, or other suitable deposition methods.

The CuMn alloy layer 26 is formed directly on surfaces of the Group VIIIB element layer 24. The CuMn alloy layer 26 includes Cu and Mn. The atomic percentage of Mn in the CuMn alloy layer 26 can be from 0.1% to 8%, and preferably from 0.2% to 5%, although lesser and greater percentages can also be employed. The balance composition (i.e., the composition of the CuMn alloy layer 26 excluding Mn) of the CuMn alloy layer 26 can be essentially Cu, or can be an alloy of Cu in which Cu is a predominant composition. In case any element other than Cu and Mn is present in the CuMn alloy layer, such element can be Al, Sn, Ti, or a combination thereof at an atomic percentage not exceeding 20%, and preferably at an atomic percentage not exceeding 5%. The CuMn alloy layer 26 can consist essentially of an alloy of Cu and Mn. Because the CuMn alloy layer 26 includes Cu, the CuMn alloy layer 26 provides strong adhesion to a Cu-containing material layer to be subsequently formed thereupon.

The thickness of the CuMn alloy layer 26 can be from 2 nm to 50 nm, and preferably from 4 nm to 25 nm, although lesser and greater thicknesses can also be employed. The CuMn alloy layer 26 can be formed by physical vapor deposition (PVD), chemical vapor deposition (CVD), electroless plating, evaporation, or other suitable deposition methods.

Figure 3A:
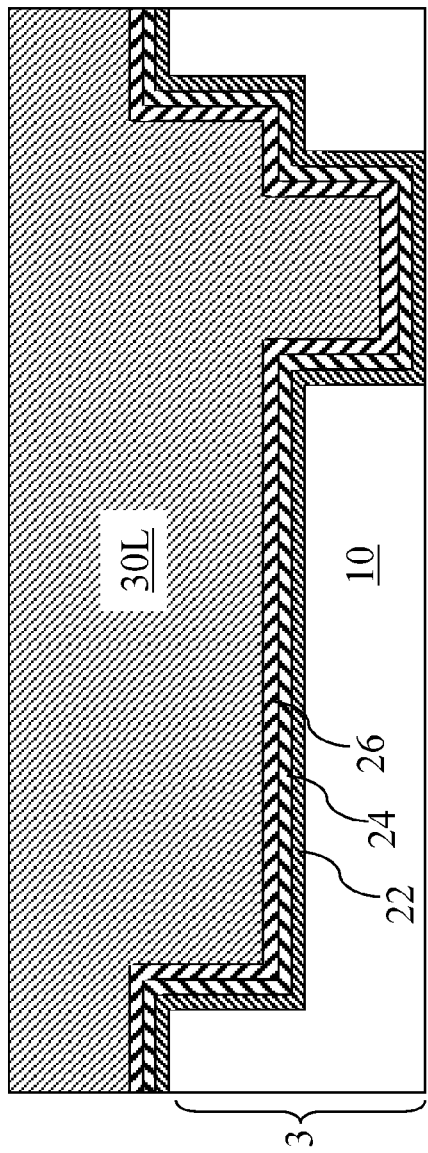
FIGS. 3A and 3B are views of the first exemplary structure after formation of a Cu-containing material layer according to the first embodiment of the present invention.
Figure 3B:
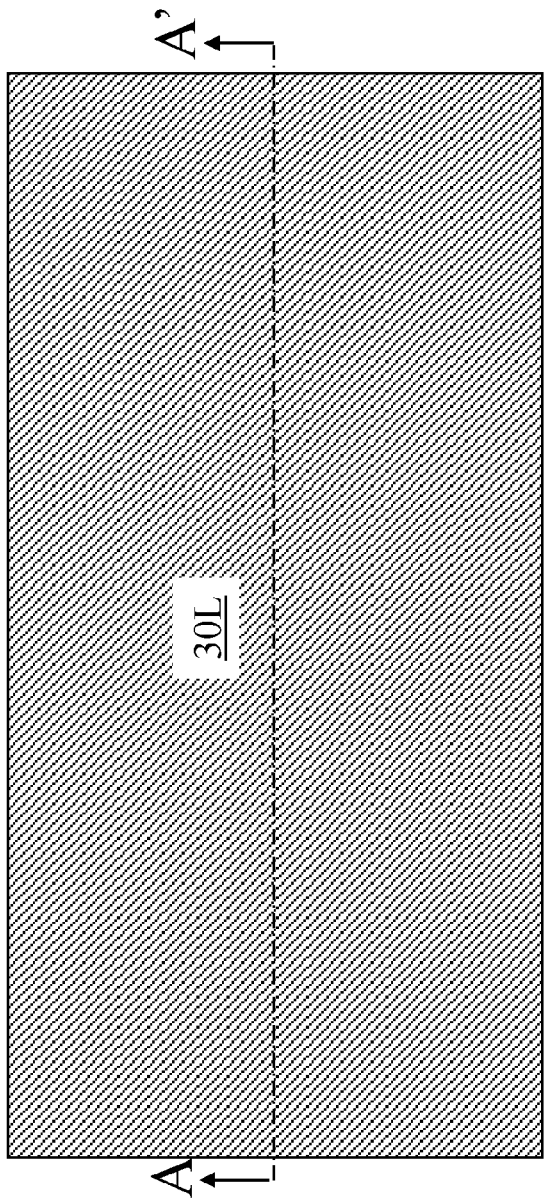

Referring to FIGS. 3A and 3B, a Cu-containing material layer 30L is deposited directly n the surfaces of the CuMn alloy layer 26. The entirety of the Cu-containing material layer 30L is of integral construction, i.e., physically connected. The Cu-containing material layer 30L may be formed by electroplating, electroless plating, physical vapor deposition (PVD, i.e., sputtering), chemical vapor deposition, or a combination thereof. For example, the Cu-containing material layer 30L may be formed by physical vapor deposition of a thin seed layer containing a metal and electroplating of the same metal. The Cu-containing material layer 30L includes copper. The Cu-containing material layer 30L can be composed of elemental Cu, or can be composed of a Cu-containing alloy. In case the Cu-containing material layer 30L is composed of a Cu-containing alloy, the Cu-containing material layer 30L can include Al, Sn, and/or Ti at an atomic concentration not greater than 10%, and preferably at an atomic concentration not greater than 3%.

The thickness of the Cu-containing material layer 30L is sufficient to completely fill the at least one recess 19 (See FIG. 1A) below the topmost surface of the dielectric material layer 10. In case the at least one recess 19 includes a line trench having the depth d (See FIG. 1A), the thickness of the Cu-containing material layer 30L is greater than the depth d. Typically, the thickness of the Cu-containing material layer 30L is from 100 nm to 4 μm, and typically from 200 nm to 2 μm, although lesser and greater thicknesses can also be employed.

Figure 4A:
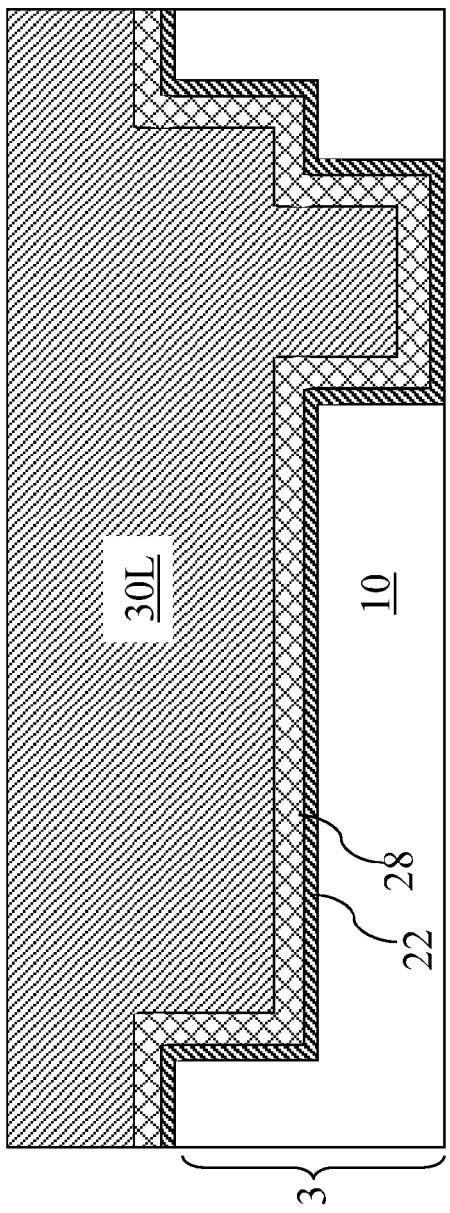
FIGS. 4A and 4B are views of the first exemplary structure after annealing according to the first embodiment of the present invention.
Figure 4B:
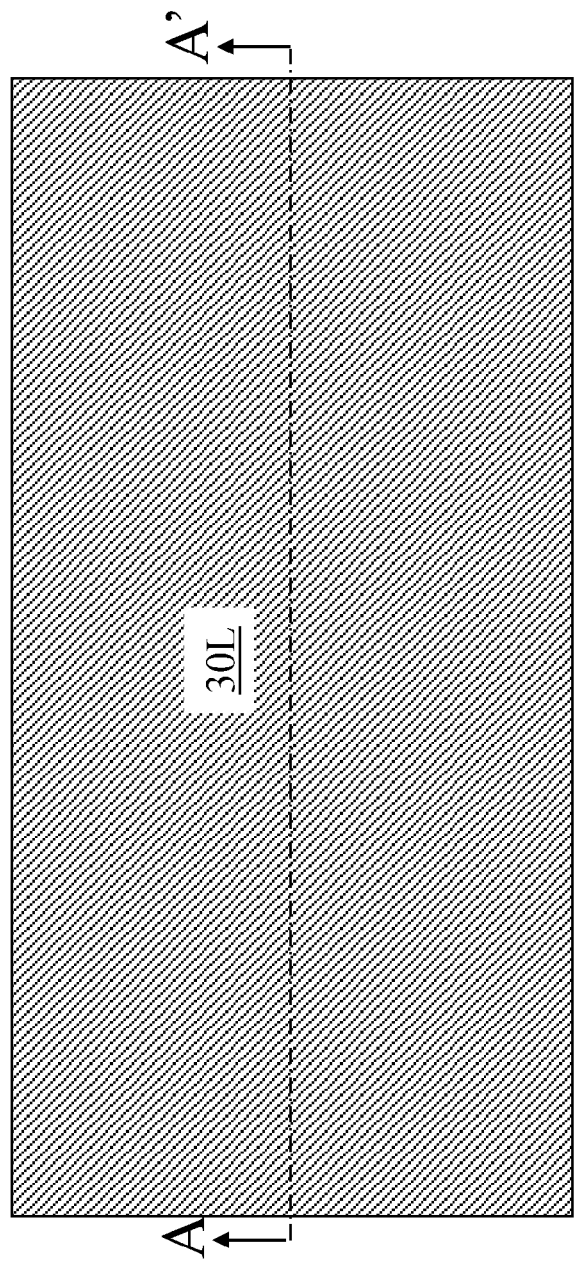

Referring to FIGS. 4A and 4B, the first exemplary structure is annealed to effect diffusion of Mn from the CuMn alloy layer 26 into the Group VIIIB element layer 24. In one embodiment, the Cu-containing material layer 30L can be annealed at temperature from 100° C. to 400° C. for a duration from 30 minutes to 2 hours. One effect of the anneal is to promote the grain growth in the Cu-containing material layer 30L, thereby lowering the resistivity of the material in the Cu-containing material layer 30L. Typically, grain sizes have a characteristic dimension which is the lesser of the width of the at least one recess 19 and the thickness of the Cu-containing material layer 30L.

Another effect of the anneal is to promote the diffusion of Mn from the CuMn alloy layer 26. Since Mn reacts strongly with the Group VIIIB elements, a concentration gradient of Mn develops in the CuMn alloy layer 26 during the anneal. As Mn atoms diffuse into the Group VIIIB element layer 24 and captured by the Group VIIIB elements to form an alloy of Mn and at least one Group VIIIB element, the lack of diffusion of Mn from the Group VIIIB element layer 24 into the CuMn alloy layer 26 maintains the concentration gradient of Mn. The concentration gradient of Mn serves to maintain the driving force for the diffusion of Mn from the CuMn alloy layer 26 until the CuMn alloy layer 26 is substantially depleted of Mn atoms, i.e., until the Mn concentration in the CuMn alloy layer 26 becomes so low that the remaining materials are substantially free of Mn and become part of the Cu-containing material layer 30L.

As the remaining portion of the CuMn alloy layer 26 loses Mn and become integrated into the Cu-containing material layer 30L as the remaining materials in the CuMn alloy layer 26 and the original material of the Cu-containing material layer 30L intermix, the VIIIB element layer 24 absorbs Mn atoms to become a metallic alloy liner 28. The metallic alloy layer 28 includes Mn and at least one Group VIIIB element. During the anneal, Mn atoms in the CuMn alloy layer 26 as originally deposited diffuses into the Group VIIIB element layer 24 to form the metallic alloy liner 28. Thus, the Group VIIIB element layer 24 acquires additional Mn atoms to become the metallic alloy liner 28. At the same time, the CuMn alloy layer 26 loses Mn so that the remaining portion of the CuMn alloy layer 26 has less Mn than the Mn concentration in the CuMn alloy layer 26 as originally deposited.

The CuMn alloy layer 26 typically loses more than 50% of Mn during the annealing, and more typically, the CuMn alloy layer 26 loses more than 90% of Mn during the annealing. The material in the remaining portion of the CuMn alloy layer 26 intermixes with the material of the Cu-containing material layer 30L. As a result of the diffusion of Mn, the Mn concentration within the cooper grains and at copper grain boundaries is kept low after the anneal. After the anneal, the concentration of Mn is typically less than 0.5% in atomic concentration in the Cu-containing material layer 30L, and is more typically less than 0.1% in atomic concentration in the Cu-containing material layer 30L. The low Mn concentration in the Cu-containing material layer 30L provides the advantage of high conductivity because the heterogeneous material other than Cu is reduced in the Cu-containing material layer 30L. In general, the higher the purity of Cu in the Cu-containing material layer 30L (i.e., the lesser the amount of impurity atoms in the Cu-containing material layer 30L), the higher the conductivity of the Cu-containing material layer 30L.

Once the metallic alloy liner 28 including Mn and the at least one Group VIIIB element is formed, the metallic alloy liner 28 functions as a strong diffusion barrier layer against diffusion of copper and/or oxygen. Mn within the metallic alloy liner combines with oxygen during the anneal to form MnO. Further the metallic alloy liner 28 functions as a strong adhesive layer that adheres both to the barrier metallic layer 22 and the Cu-containing material layer 30L. Thus, the presence of the metallic alloy liner 28 enhances resistance to electromigration, and consequently, improves reliability of at least one conductive lines subsequently formed from the Cu-containing material layer 30L.

Figure 5A:
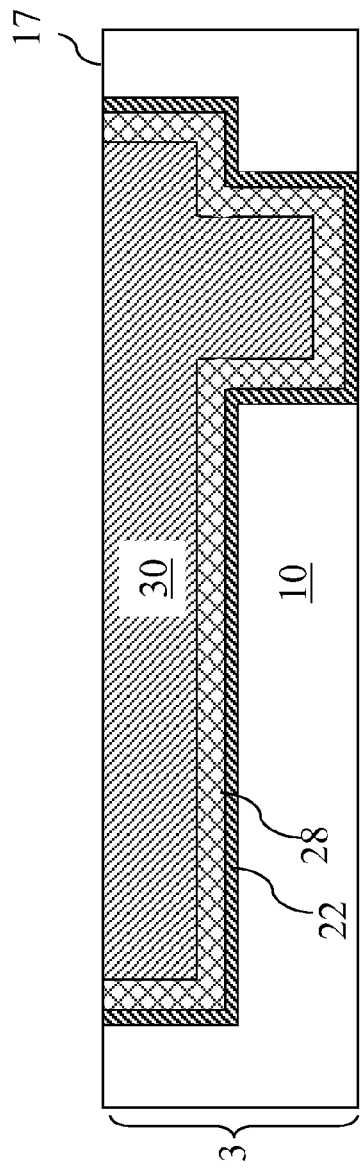
FIGS. 5A and 5B are views of the first exemplary structure after planarization of the Cu-containing material layer to form a Cu-containing conductive structure according to the first embodiment of the present invention.
Figure 5B:
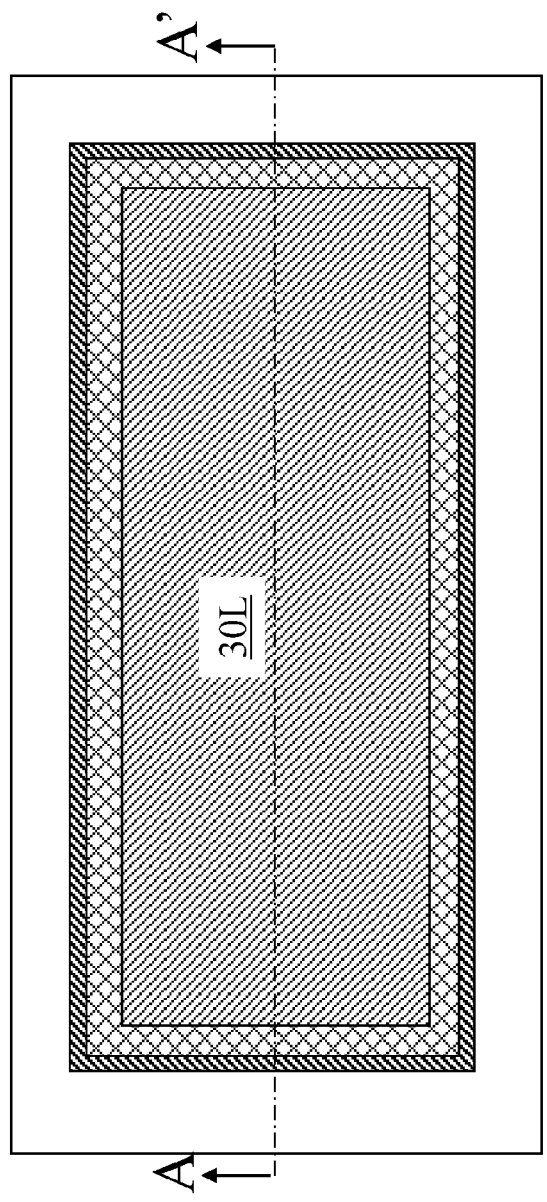

Referring to FIGS. 5A and 5B, excess material of the Cu-containing material layer 30L above the topmost surface 17 of the dielectric material layer 10 is planarized, for example, by chemical mechanical polishing (CMP). The portions of the barrier metallic liner 22 and the metallic alloy liner 22 above the topmost surface 17 of the dielectric material layer 10 are also removed by the planarization. Optionally, the portion of the barrier metallic liner 22 and/or the metallic alloy liner 26 above the topmost surface 17 of the dielectric material layer 10 may be employed as a stopping layer during the removal of the Cu-containing material layer 30L. In this case, the planarization process may be a two step process in which a first step is a self-stopping process that removes the portion of the Cu-containing material layer 30L above portion of the barrier metallic liner 22 and/or the metallic alloy liner 26 located above the topmost surface 17 of the dielectric material layer 10, and a second step is a process that removes the portion of the barrier metallic liner 22 and/or the metallic alloy liner 26 above the topmost surface 17 of the dielectric material layer 10 to expose the topmost surface 17 of the dielectric material layer 10.

An upper surface of the dielectric material layer 10, which is the topmost surface 17 of the dielectric material layer 10, is exposed after the planarization process. The remaining portion of the Cu-containing material layer 30L constitutes a Cu-containing conductive structure 30, which is embedded in the dielectric material layer 10 and has a topmost surface that is coplanar with the topmost surface 17 of the dielectric material layer.

The Cu-containing conductive structure 30 is laterally confined within the periphery of the at least one recess 19 (See FIGS. 1A and 1B). The Cu-containing conductive structure 30 constitutes at least one metal line, at least one metal via, or a combination thereof.

The first exemplary structure includes a dielectric material layer 10 having at least one patterned recess therein, a barrier metallic liner 22 located directly on surfaces of the dielectric material layer 10 in the at least one patterned recess, a metallic alloy liner 28 located in the at least one patterned recess, and a Cu-containing conductive structure 30 located on the metallic alloy liner 28. The barrier metallic liner 22 includes at least one metal selected from Group IVB elements, Group VB elements, and GroupVIB elements. Preferably, the metallic alloy layer 28 consists essentially of Mn and at least one Group VIIIB element. Preferably, the at least one Group VIIIB includes at least one of Ir and Ru.

The barrier metallic liner 22, the metallic alloy liner 28, and the Cu-containing conductive structure 30 collectively constitute at least one conductive interconnect structure (22, 28, 30). The MnO in the metallic alloy liner 28 acts as a strong barrier to oxygen diffusion, thereby enhancing the reliability of the at least one conductive interconnect structure (22, 28, 30). The dielectric material layer 10 and the at least one conductive interconnect structure (22, 28, 30) collectively constitute a lower level metal interconnect structure 3, which fills the entirety of the volume between the topmost surface of the dielectric material layer 17 and a bottommost surface of the dielectric material layer 10. In other words, the dielectric material layer 10 and the at least one conductive interconnect structure (22, 28, 30) complimentarily fill the lower level metal interconnect structure 3.

Referring to FIGS. 6A and 6B, additional structures may optionally be formed on the lower level metal interconnect structure 3. For example, an optional dielectric cap layer 42 may be formed directly on the lower level metal interconnect structure 3. A second dielectric material layer 40 may then be formed directly on the optional dielectric cap layer 42. The optional dielectric cap layer 42 is optional, i.e., may, or may not, be formed. In case an optional dielectric cap layer 42 is not formed, a second dielectric material layer 40 is formed directly on the lower level metal interconnect structure 3.

The optional dielectric cap layer 42 typically comprises a non-porous dielectric material such as silicon nitride, silicon oxynitride, BLoK™ which is a low-k material containing Si, C, O, and H and formed by plasma enhanced chemical vapor deposition and provided, for example, by Applied Materials Inc.™, or NBLoK™ which is a low-k material containing Si, Co, O, H, and N and formed by plasma enhanced chemical vapor deposition and provided, for example, by Applied Materials Inc.™ The optional dielectric cap layer 42, if present, provides protection of the Cu-containing conductive structure 30 from in-diffusion of impurities as well as enhancement of electromigration resistance of the Cu-containing conductive structure 30. The thickness of the optional dielectric cap layer 42 may be from 3 nm to 90 nm, and typically from 6 nm to 40 nm, although lesser and greater thicknesses are also contemplated herein.

The second dielectric material layer 40 may comprise any material that may be employed for the dielectric material layer 10 as described above. The second dielectric material layer 40 may comprise the same material as, or a different material from, the dielectric material layer 10. The thickness of the second dielectric material layer 40 may be from 50 nm to 2 µm, and typically from 100 to 500 nm, although lesser and greater thicknesses can also be employed.

A patterned recess 59 can be formed in the second dielectric material layer 40 and in the optional dielectric cap layer 42 by lithographic methods and an anisotropic etch. For example, a photoresist may be applied over the second dielectric material layer 40 and lithographically patterned to include a hole in the photoresist. The pattern in the photoresist is transferred into the second dielectric material layer 40 and the optional dielectric cap layer 42 by vertically recessing the exposed portion of the top surface of the second dielectric material layer 40 to reach the top surface of the lower level metal interconnect structure 3. The photoresist is subsequently removed selective to the second dielectric material layer 40. The horizontal cross-sectional area of the patterned recess 59 may have a substantially circular shape, any polygonal shape, any elliptical shape, any curvilinear closed shape, or a combination thereof. If a dual damascene method is employed to from the patterned recess 59, a line trench may be formed in an upper portion of the second dielectric material layer 40 by employing another lithography step and another anisotropic etch prior to, or after, the formation of the patterned recess 29 as known in the art. A portion of a top surface of the Cu-containing conductive structure 30 is exposed at the bottom of the patterned recess 59.

Figure 7A:
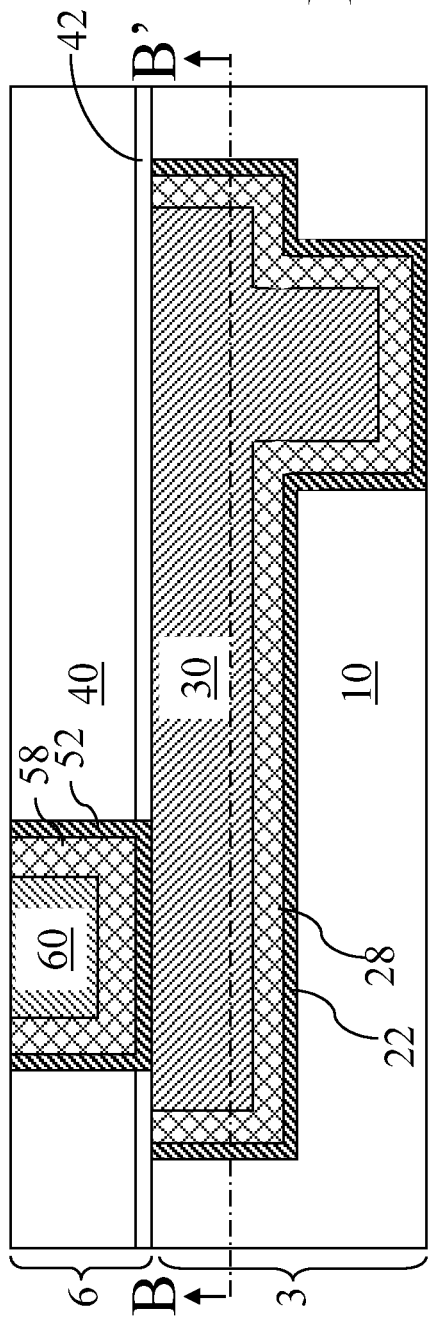
FIGS. 7A and 7B are views of the first exemplary structure after formation of a second Cu-containing conductive structure according to the first embodiment of the present invention.
Figure 7B:
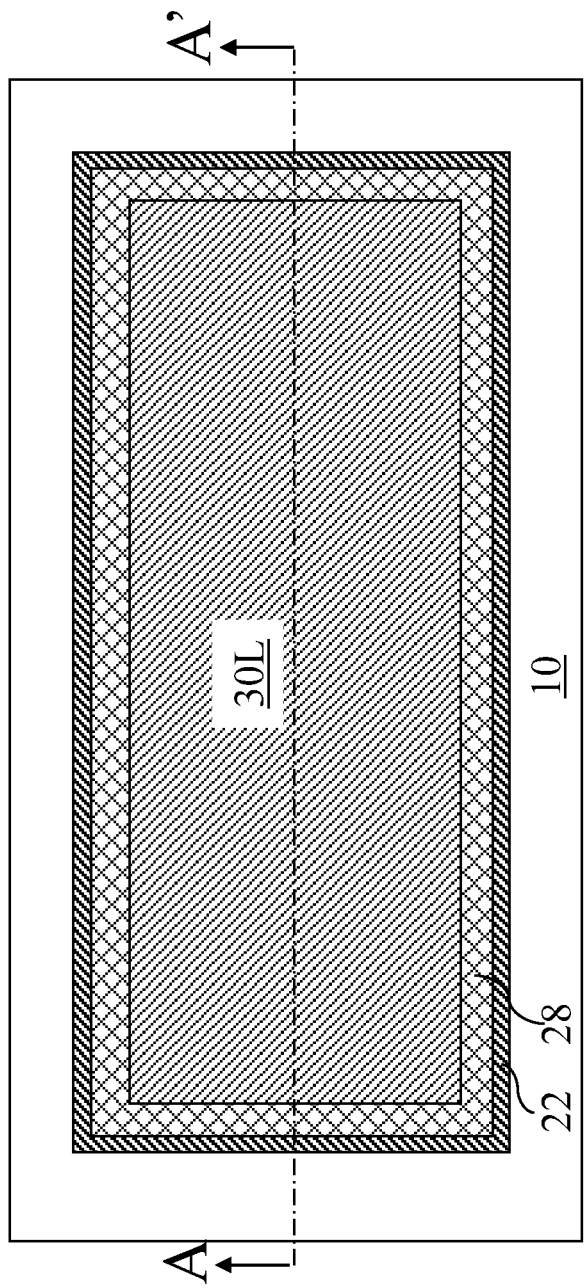

Referring to FIGS. 7A and 7B, the steps of FIGS. 2A-5B can be employed repeatedly to form a second barrier metallic liner 52 located directly on surfaces of the second dielectric material layer 40, a second metallic alloy liner 58 located on the second dielectric material layer 40, and a second Cu-containing conductive structure 60 located on the second metallic alloy liner 58. The second barrier metallic liner 52 includes at least one metal selected from Group IVB elements, Group VB elements, and GroupVIB elements. Preferably, the second metallic alloy layer 58 consists essentially of Mn and at least one Group VIIIB element. Preferably, the at least one Group VIIIB includes at least one of Ir and Ru.

Figure 8A:
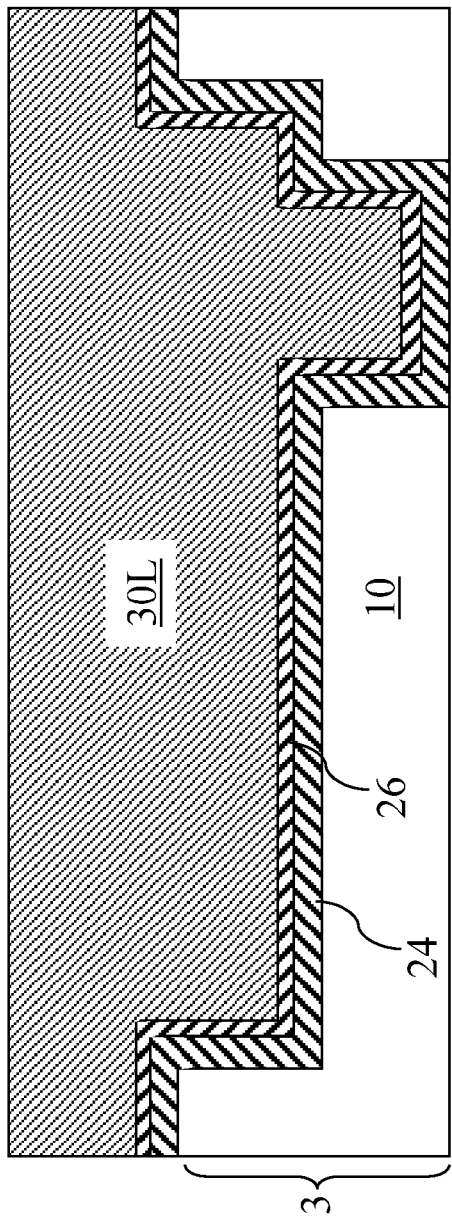
FIGS. 8A and 8B are views of a second exemplary structure after formation of a Cu-containing material layer according to a second embodiment of the present invention.
Figure 8B:
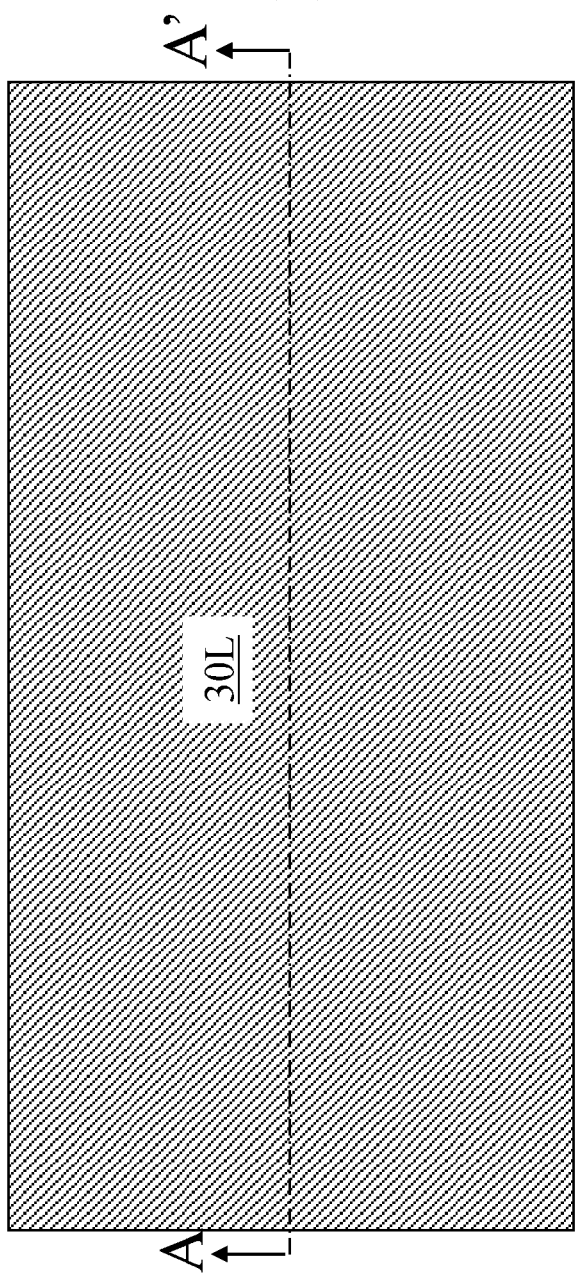

Referring to FIGS. 8A and 8B, a second exemplary structure according to a second embodiment of the present invention is derived from the first exemplary structure of FIGS. 1A and 1B. At a step corresponding to FIGS. 2A and 2B, a metallic liner stack is deposited on all exposed surfaces of the at least one recess 19 and the topmost planar surface of the dielectric material layer 10. The metallic liner stack includes, from bottom to top, a Group VIIIB element layer 24 and a CuMn alloy layer 26. The step of depositing a barrier metallic liner 22 is omitted in the second embodiment. Therefore, the Group VIIIB element layer 24 is formed directly on surfaces of the dielectric material layer 10 in the at least one patterned recess.

The Group VIIIB element layer 24 and the CuMn alloy layer 26 can be formed employing the same methods as in the first embodiment. The composition of the Group VIIIB element layer 24 can be the same as in the first embodiment. The thickness of the Group VIIIB element layer 24 can be from 1 nm to 20 nm, although lesser and greater thicknesses can also be employed. The composition and the thickness of the CuMn alloy layer 26 can be the same as in the first embodiment.

A Cu-containing material layer 30L is formed on the CuMn alloy layer 26 as in the first embodiment. The structure in FIGS. 8A and 8B can be the same with the structure in FIGS. 3A and 3B except for the absence of a barrier metallic liner 22 and the consequent direct contact between the barrier metallic liner 22 and the CuMn alloy layer 26.

Referring to FIGS. 9A and 9B, the anneal step and the planarization step corresponding to FIGS. 4A-5B of the first embodiment is performed to remove excess material above the topmost surface 17 of the dielectric material layer 10 and to form a metallic alloy layer 28. The Mn atoms diffuse from the CuMn alloy layer 26 into the Group VIIIB element layer 24 during the anneal so that an upper portion of the Group VIIIB element layer 24 and the Mn atoms diffused therein collectively form a metallic alloy liner 28. The metallic alloy layer 28 has the same composition as in the first embodiment. The lower portion of the Group VIIIB element layer 24, into which diffusion of Mn atoms is insignificant, forms a thinned Group VIIIB element layer 24', which has a lesser thickness than the thickness of the Group VIIIB element layer 24 prior to the anneal. The thickness of the thinned Group VIIIB element layer 24' can be from 0.5 nm to 10 nm, although lesser and greater thicknesses can also be employed. During the planarization step, the metallic alloy liner 28 and/or the thinned Group VIIIB element layer 24' can be employed as a stopping layer.

The metallic alloy layer 28 includes Mn and at least one Group VIIIB element as in the first embodiment. During the anneal, Mn atoms in the CuMn alloy layer 26 as originally deposited diffuses into an upper portion of the Group VIIIB element layer 24 to form the metallic alloy liner 28. Specifically, the Group VIIIB element layer 24 acquires additional Mn atoms to become the metallic alloy liner 28 as in the first embodiment. At the same time, the CuMn alloy layer 26 loses Mn so that the remaining portion of the CuMn alloy layer 26 has less Mn than the Mn concentration in the CuMn alloy layer 26 as originally deposited. The CuMn alloy layer 26 loses more than 50% of Mn during the annealing, and preferably, the CuMn alloy layer 26 loses more than 90% of Mn during the annealing. The material in the remaining portion of the CuMn alloy layer 26 intermixes with the material of the Cu-containing material layer 30L as in the first embodiment. The remaining portion, i.e., the lower portion, of the Group VIIIB element layer 24 constitutes the thinned Group VIIIB element layer 24'. The thinned Group VIIIB element layer 24' directly contacts the dielectric material layer 10. Optionally, additional structures can be formed on the second exemplary structure in FIGS. 9A and 9B as in the first embodiment.

Referring to FIGS. 10A and 10B, a third exemplary structure according to a third embodiment of the present invention is formed employing the same processing steps of the second embodiment. The Group VIIIB element layer 24 and the CuMn alloy layer 26 can be formed employing the same methods as in the first embodiment. The composition of the Group VIIIB element layer 24 can be the same as in the first embodiment. The thickness of the Group VIIIB element layer 24 can be from 1 nm to 5 nm, although lesser and greater thicknesses can also be employed. The composition and the thickness of the CuMn alloy layer 26 can be the same as in the first embodiment.

A Cu-containing material layer 30L is formed on the CuMn alloy layer 26 as in the first embodiment. The difference between the structure of FIGS. 10A and 10B and the structure of FIGS. 8A and 8B is a reduction in the thickness of the Group VIIIB element layer 24.

Figure 11A:
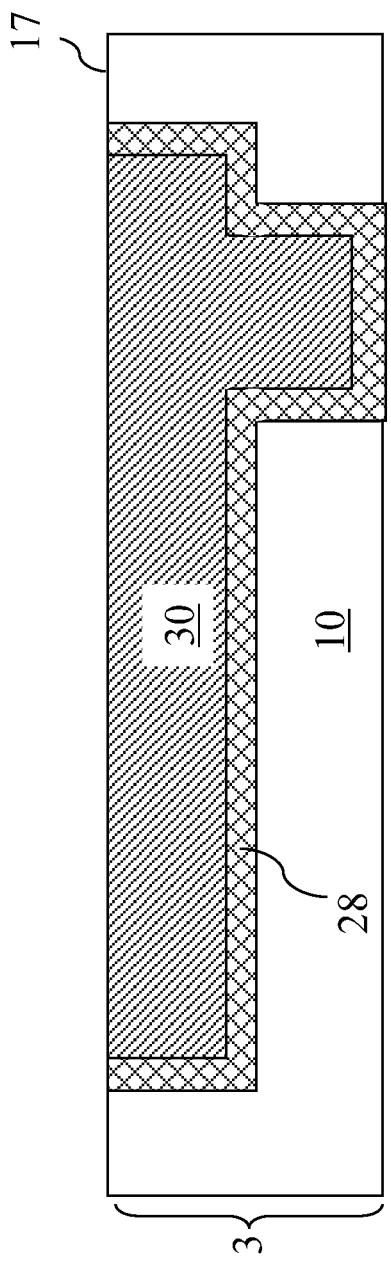
FIGS. 11A and 11B are views of the third exemplary structure after annealing and planarization of the Cu-containing material layer to form a Cu-containing conductive structure according to the third embodiment of the present invention.
Figure 11B:
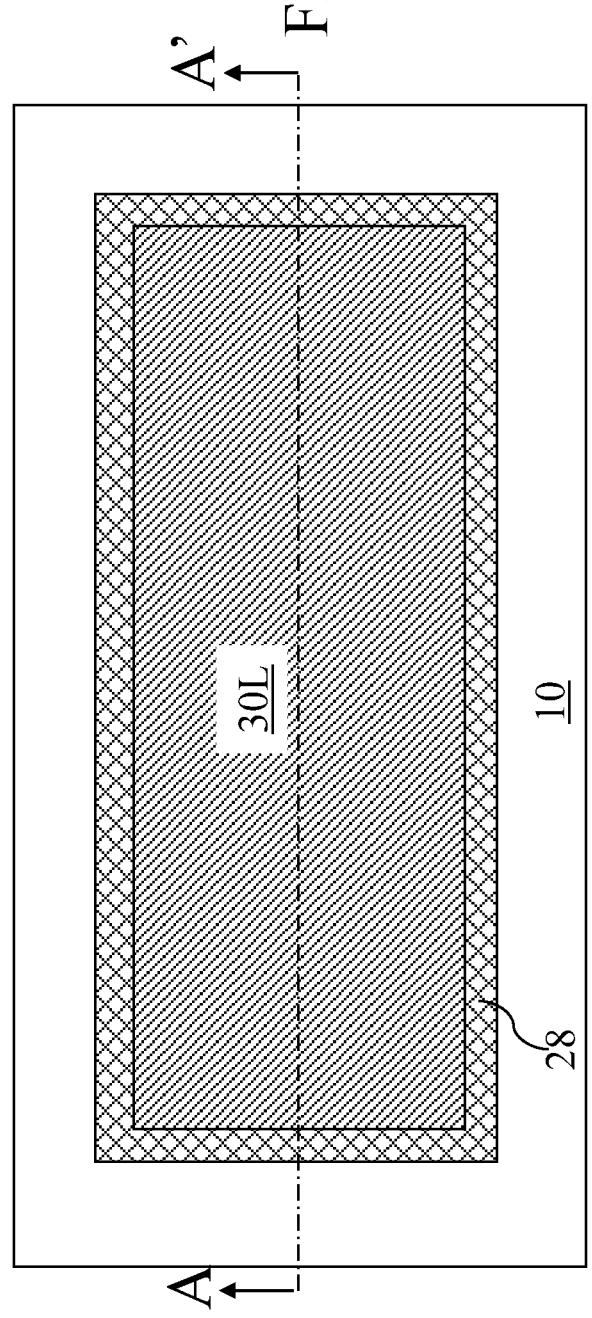

Referring to FIGS. 11A and 11B, the anneal step and the planarization step corresponding to FIGS. 4A-5B of the first embodiment is performed to remove excess material above the topmost surface 17 of the dielectric material layer 10 and to form a metallic alloy layer 28. The Mn atoms diffuse from the CuMn alloy layer 26 into the Group VIIIB element layer 24 during the anneal. The entirety of the Group VIIIB element layer 24 is converted into a metallic alloy liner 28 as Mn atoms diffuse into the Group VIIIB element layer 24. Thus, the metallic alloy liner 28 contacts the dielectric material layer 10. The metallic alloy layer 28 has the same composition as in the first embodiment. The remaining material of the CuMn alloy layer 26 intermixes with the Cu-containing material layer 30L as originally deposited to introduce a minimal change in the composition of the Cu-containing material layer 30L. During the planarization step, the metallic alloy liner 28 can be employed as a stopping layer.

The metallic alloy layer 28 includes Mn and at least one Group VIIIB element as in the first embodiment. Optionally, additional structures can be formed on the second exemplary structure in FIGS. 11A and 11B as in the first embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A metal interconnect structure comprising:
a dielectric material layer having at least one patterned recess therein;
a barrier metallic liner located directly on surfaces of said dielectric material layer in said at least one patterned recess, wherein said barrier metallic liner comprises at least one elemental metal selected from Group IVB elements, Group VB elements, and Group VIB elements;
a metallic liner stack located in said at least one patterned recess, said metallic liner stack comprising a Group VIIIB element layer and a CuMn alloy layer, said Group VIIIB element layer is a layer of a single elemental metal selected from Fe, Co, Ni, Ru, Rh, Pd, Os, Ir, and Pt; and
a Cu-containing conductive structure located on said metallic liner stack, wherein said Group VIIIB element layer is spaced from said Cu-containing conductive structure at least by said CuMn alloy layer, and is spaced from said dielectric material layer by said barrier material layer.

2. The metal interconnect structure of claim 1, wherein said Group VIIIB element layer includes Ir or Ru.

3. The metal interconnect structure of claim 1, wherein said at least one elemental metal in said barrier metallic liner comprises a layer of a single elemental metal selected from Ti, V, Cr, Zr, Nb, Mo, Hf, Ta, and W.

4. The metal interconnect structure of claim 3, wherein said single elemental metal is selected from Fe, Co, and Ni.

5. The metal interconnect structure of claim 3, wherein said single elemental metal is selected from Ru, Rh, Pd, Os, Ir, and Pt.

6. The metal interconnect structure of claim 1, wherein said at least one elemental metal in said barrier metallic liner comprises a layer of an intermetallic alloy of at least two elemental metals selected from Ti, V, Cr, Zr, Nb, Mo, Hf, Ta, and W.

7. The metal interconnect structure of claim 6, wherein said single elemental metal is selected from Fe, Co, and Ni.

8. The metal interconnect structure of claim 6, wherein said single elemental metal is selected from Ru, Rh, Pd, Os, Ir, and Pt.

9. The metal interconnect structure of claim 1, wherein said at least one elemental metal in said barrier metallic liner comprises a layer of a conductive nitride of a single elemental metal selected from Ti, V, Cr, Zr, Nb, Mo, Hf, Ta, and W.

10. The metal interconnect structure of claim 9, wherein said single elemental metal is selected from Fe, Co, and Ni.

11. The metal interconnect structure of claim 9, wherein said single elemental metal is selected from Ru, Rh, Pd, Os, Ir, and Pt.

12. The metal interconnect structure of claim 1, wherein said at least one elemental metal in said barrier metallic liner comprises a layer of a conductive nitride of at least two elemental metals selected from Ti, V, Cr, Zr, Nb, Mo, Hf, Ta, and W.

13. The metal interconnect structure of claim 12, wherein said single elemental metal is selected from Fe, Co, and Ni.

14. The metal interconnect structure of claim 12, wherein said single elemental metal is selected from Ru, Rh, Pd, Os, Ir, and Pt.

15. The metal interconnect structure of claim 1, wherein said Group VIIIB element layer is in direct contact with said barrier metallic layer.

* * * * *